(12) United States Patent
Lee et al.

(10) Patent No.: US 11,182,015 B2
(45) Date of Patent: Nov. 23, 2021

(54) ORGANIC LIGHT EMITTING DISPLAY WITH TOUCH SENSOR

(71) Applicant: LG Display Co., Ltd., Seoul (KR)

(72) Inventors: Eun-Hye Lee, Paju-si (KR); Min-Joo Kim, Seoul (KR); Jae-Young Oh, Goyang-si (KR); Jae-Won Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 16/733,897

(22) Filed: Jan. 3, 2020

(65) Prior Publication Data

US 2020/0142530 A1 May 7, 2020

Related U.S. Application Data

(63) Continuation of application No. 15/436,393, filed on Feb. 17, 2017, now Pat. No. 10,572,057.

(30) Foreign Application Priority Data

Sep. 30, 2016 (KR) ........................ 10-2016-0126723

(51) Int. Cl.
*G06F 3/041* (2006.01)
*H01L 51/52* (2006.01)
(Continued)

(52) U.S. Cl.
CPC ........ *G06F 3/04164* (2019.05); *G06F 3/0412* (2013.01); *G06F 3/0443* (2019.05); *G06F 3/0446* (2019.05); *H01L 27/322* (2013.01); *H01L 27/323* (2013.01); *H01L 27/3213* (2013.01); *H01L 27/3248* (2013.01);
(Continued)

(58) Field of Classification Search
CPC .................................................. G06F 3/04164
See application file for complete search history.

(56) References Cited

U.S. PATENT DOCUMENTS

| 8,803,172 B2 | 8/2014 | Kim et al. |
| 9,323,400 B2 | 4/2016 | Kim et al. |

(Continued)

FOREIGN PATENT DOCUMENTS

| CN | 101814522 A | 8/2010 |
| CN | 104516165 A | 4/2015 |

(Continued)

OTHER PUBLICATIONS

Extended European Search Report for European Patent Application No. EP 17156003.0, dated Aug. 2, 2017, 9 Pages.
(Continued)

*Primary Examiner* — Gustavo Polo
(74) *Attorney, Agent, or Firm* — Fenwick & West LLP

(57) ABSTRACT

Disclosed is an organic light emitting display device with a touch sensor. The display device has a touch sensor that is directly disposed on a sealing part, thus removing the necessity of an additional adhesion process, simplifying a manufacturing process and reducing manufacture cost. In addition, the display device with the touch sensor includes a display cover electrode of a display pad that is made of a same material as a conductive layer included in the touch sensor, thus preventing damage to the display pad electrode.

41 Claims, 17 Drawing Sheets

(51) Int. Cl.
  *G06F 3/044* (2006.01)
  *H01L 27/32* (2006.01)
  *H01L 51/56* (2006.01)

(52) U.S. Cl.
  CPC ...... *H01L 27/3262* (2013.01); *H01L 51/5203* (2013.01); *H01L 51/5212* (2013.01); *H01L 51/5228* (2013.01); *H01L 51/5253* (2013.01); *H01L 51/56* (2013.01); *G06F 2203/04103* (2013.01); *G06F 2203/04111* (2013.01); *G06F 2203/04112* (2013.01); *H01L 27/3276* (2013.01); *H01L 2227/323* (2013.01)

(56) References Cited

U.S. PATENT DOCUMENTS

| | | | |
|---|---|---|---|
| 9,367,162 | B2 | 6/2016 | Lee |
| 9,660,003 | B2 | 5/2017 | Sato et al. |
| 9,696,838 | B2 | 7/2017 | Lee |
| 10,013,088 | B2 | 7/2018 | Kim et al. |
| 10,170,727 | B2 | 1/2019 | Sato et al. |
| 2010/0213482 | A1 | 8/2010 | Kim et al. |
| 2012/0062481 | A1 | 3/2012 | Kim et al. |
| 2014/0117316 | A1 | 5/2014 | Choi |
| 2014/0145979 | A1 | 5/2014 | Lee |
| 2015/0060817 | A1 | 3/2015 | Sato et al. |
| 2015/0091014 | A1 | 4/2015 | Hong |
| 2015/0170575 | A1 | 6/2015 | Kwak et al. |
| 2015/0185960 | A1 | 7/2015 | Kim |
| 2016/0103537 | A1 | 4/2016 | Park et al. |
| 2016/0231846 | A1 | 8/2016 | Kim et al. |
| 2016/0283005 | A1 | 9/2016 | Lee |
| 2016/0365027 | A1* | 12/2016 | Suh ................ G06F 3/0443 |
| 2017/0090651 | A1 | 3/2017 | Kang et al. |
| 2017/0222180 | A1 | 8/2017 | Sato et al. |
| 2017/0262109 | A1* | 9/2017 | Choi ................ H01L 51/5253 |
| 2018/0292936 | A1 | 10/2018 | Kim et al. |

FOREIGN PATENT DOCUMENTS

| | | | |
|---|---|---|---|
| KR | 10-2012-0060926 | A | 6/2012 |
| KR | 10-2013-0110539 | A | 10/2013 |
| KR | 10-2014-0065598 | A | 5/2014 |
| KR | 10-2014-0069708 | A | 6/2014 |
| KR | 10-2014-0096507 | A | 8/2014 |
| KR | 10-2015-0026921 | A | 3/2015 |
| KR | 10-2015-0035165 | A | 4/2015 |
| KR | 10-2016-0017336 | A | 2/2016 |
| KR | 10-2016-0080042 | A | 7/2016 |

OTHER PUBLICATIONS

European Patent Office, Office Action, EP Patent Application No. 17156003.0, dated Oct. 1, 2019, eight pages.
Korean Intellectual Property Office, Office Action, KR Patent Application No. 10-2018-0151973, dated Dec. 14, 2018, seven pages (with concise explanation of relevance).
Office Action for Korean Patent Application No. KR 10-2016-0126723, dated Jan. 9, 2018, 8 Pages, (With Concise Explanation of Relevance).
Taiwanese Intellectual Property Office, Office Action, Taiwanese Patent Application No. 106105939, dated Jun. 11, 2018, 19 pages.
United States Office Action, U.S. Appl. No. 15/436,393, dated Aug. 29, 2019, seven pages.
United States Office Action, U.S. Appl. No. 15/436,393, dated Apr. 11, 2019, six pages.
United States Office Action, U.S. Appl. No. 15/436,393, dated Oct. 17, 2018, five pages.
China National Intellectual Property Administration, Office Action, CN Patent Application No. 201710072740.X, dated Jun. 1, 2021, 15 pages.

* cited by examiner

ORGANIC LIGHT EMITTING DISPLAY WITH TOUCH SENSOR

CROSS-REFERENCE TO RELATED APPLICATIONS

This application is a continuation of U.S. patent application Ser. No. 15/436,393 filed on Feb. 17, 2017 which claims the benefit of Korean Patent Application No. 10-2016-0126723, filed on Sep. 30, 2016, each of which is hereby incorporated by reference in its entirety.

BACKGROUND

Field of Technology

The present disclosure relates to an organic light emitting display with a touch sensor and a method of manufacturing the same, and more particularly, to an organic light emitting display with a touch sensor and a method of manufacturing the same to simplify a manufacturing process and reduce manufacturing costs.

Discussion of the Related Art

A touchscreen is a device for inputting a user's command by selecting an instruction shown on a screen of a display or the like with the hand of the user or an object. That is, the touchscreen converts a contact position thereof that directly contacts the hand of the user or the object into an electrical signal and receives the instruction selected in the contact position as an input signal. Such a touchscreen can replace an additional input device such as a keyboard or mouse which is operated in connection with a display and application thereof is thus gradually expanding.

In general, such a touchscreen is often attached to the front surface of a display panel such as a liquid crystal display panel or an organic electroluminescent display panel through an adhesive agent. In this case, there are problems of a complicated overall process and increased costs resulting from an additional attachment process, because the touchscreen is separately produced and is attached to the front surface of the display panel.

SUMMARY

Accordingly, the present disclosure is directed to a an organic light emitting display with a touch sensor and a method of manufacturing the same that substantially obviate one or more problems due to limitations and disadvantages of the related art.

An object of the present disclosure is to provide an organic light emitting display with a touch sensor and a method of manufacturing the same to simplify a manufacturing process and reduce manufacturing costs.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display with a touch sensor according to the present invention has a structure in which a touch sensor is directly disposed on a encapsulation part, thus removing the necessity of an additional adhesion process, simplifying a manufacturing process and reducing manufacturing costs. In addition, the organic light emitting display with a touch sensor has a structure in which a display cover electrode of a display pad is disposed on the same plane as a conductive layer included in the touch sensor using the same material as the conductive layer, thus preventing damage to the display pad electrode.

In one embodiment, a display device comprises: a thin film transistor disposed in an active region of a substrate that displays images; a display pad disposed in a non-active region of the substrate that does not display images; a light emitting device connected to the thin film transistor; an encapsulation layer on the light emitting device; a touch sensor on the encapsulation layer in the active region of the substrate, the touch sensor including a conductive layer; and a touch pad in the non-active region of the substrate and the touch pad connected to the touch sensor, wherein the display pad includes a display pad electrode and a display cover electrode over the display pad electrode, the display pad electrode connected to a signal line in the active region and the display cover electrode covering a portion of the display pad electrode and made of a same material as the conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to different embodiments of the present disclosure, examples of which are illustrated in the accompanying drawings. Wherever possible, the same reference numbers will be used throughout the drawings to refer to the same or like parts.

Hereinafter, embodiments of the present disclosure will be described with reference to the annexed drawings in detail.

Figure 1:
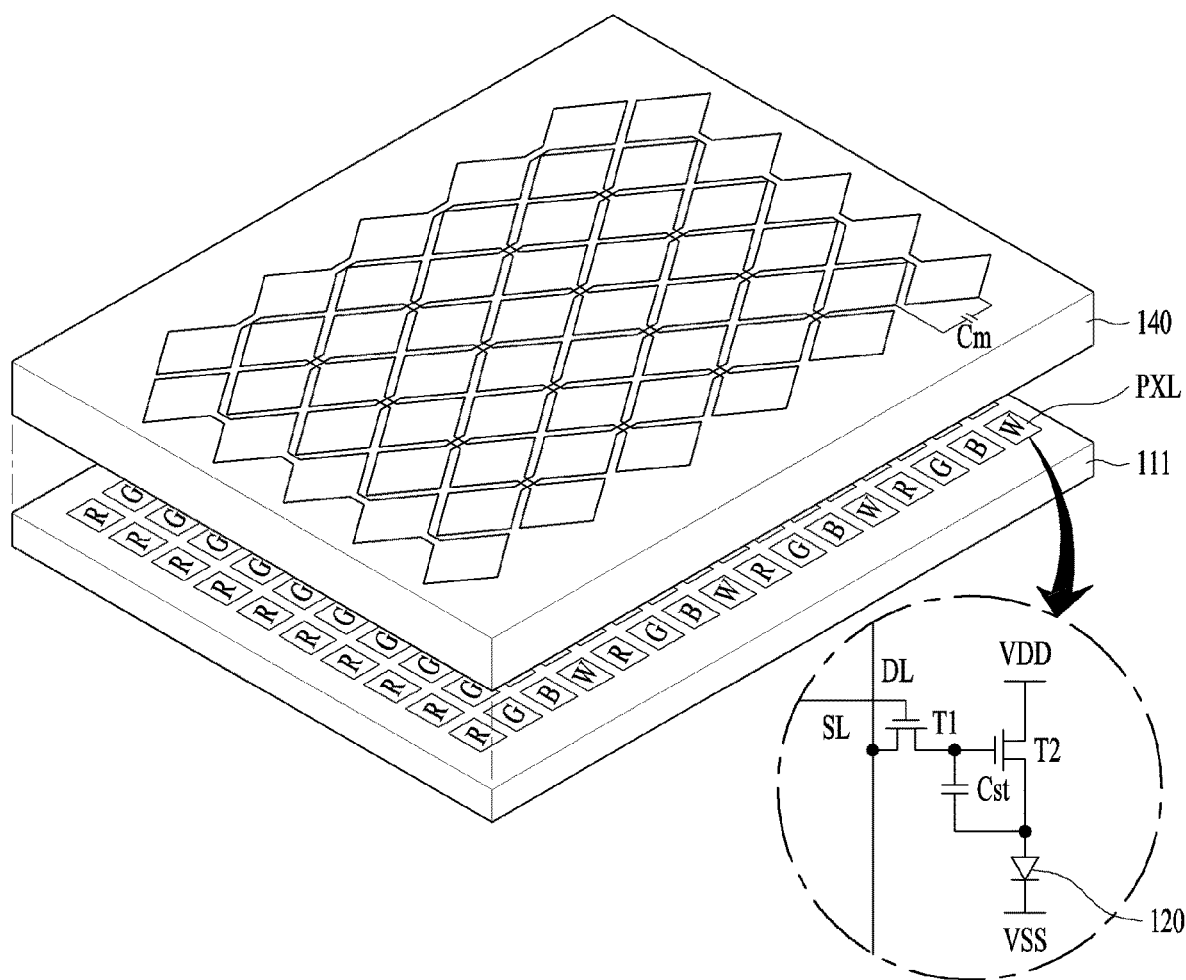
FIG. 1 is a perspective view illustrating an organic light emitting display with a touch sensor according to a first embodiment of the present disclosure.
Figure 2:
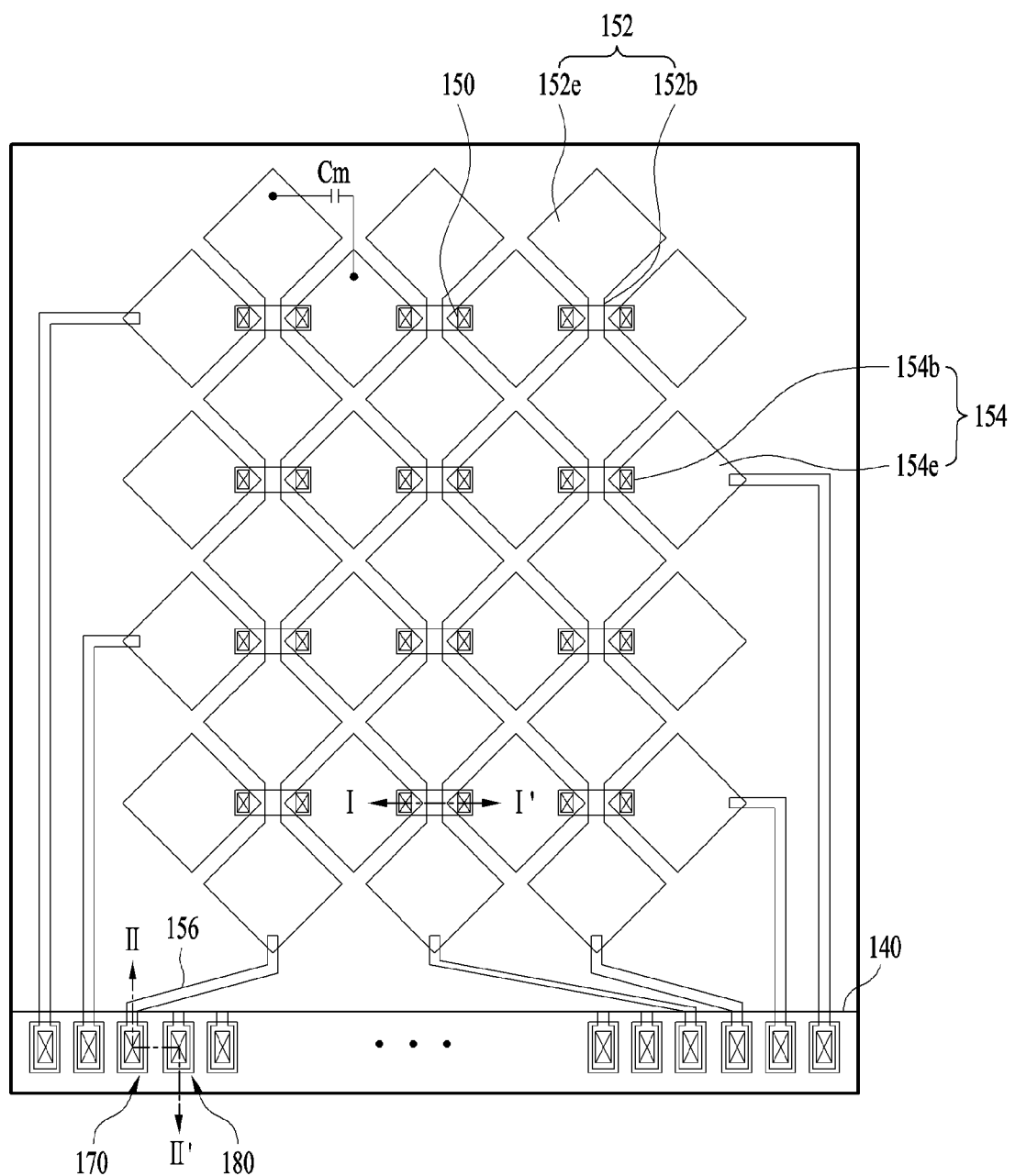
FIG. 2 is a plan view illustrating the organic light emitting display with a touch sensor shown in FIG. 1 according to the first embodiment of the present disclosure.

FIGS. 1 and 2 are a perspective view and a plan view illustrating an organic light emitting display with a touch sensor according to the present disclosure, respectively.

The organic light emitting display with a touch sensor illustrated in FIGS. 1 and 2 detects variation in mutual capacitance (Cm) by touch of a user through touch electrodes 152e and 154e during a touch period to sense the presence of touch and touch position. In addition, the organic light emitting display with a touch sensor displays an image through a unit pixel including a light emitting device 120 during a display period. The unit pixel includes red (R), green (G) and blue (B) sub-pixels (PXL), or red (R), green (G), blue (B) and white (W) sub-pixels (PXL).

For this purpose, the organic light emitting display shown in FIG. 1 includes a plurality of sub-pixels (PXL) disposed in the form of a matrix on a substrate 111, a encapsulation part 140 disposed on the sub-pixels (PXL), and a mutual capacitance (Cm) disposed on the encapsulation part 140.

Each of the sub-pixels (PXL) includes a pixel driving circuit and a light emitting device 120 connected to the pixel driving circuit.

The pixel driving circuit includes a switching transistor (T1), a driving transistor (T2) and a storage capacitor (Cst).

The switching transistor (T1) is turned on when a scan pulse is supplied to a scan line (SL) and supplies a data signal supplied to a data line (DL) to the storage capacitor (Cst) and a gate electrode of the driving transistor (T2).

In response to the data signal supplied to the gate electrode of the driving transistor (T2), the driving transistor (T2) controls a current (I) supplied from a high-voltage power (VDD) line to the light emitting device 120, thereby regulating the amount of light emitted by the light emitting device 120. In addition, although the switching transistor (T1) is turned off, the driving transistor (T2) supplies a predetermined current (I) by the voltage charged in the storage capacitor (Cst) until a data signal of the next frame is supplied, thereby maintaining light emission of the light emitting device 120.

Figure 3:
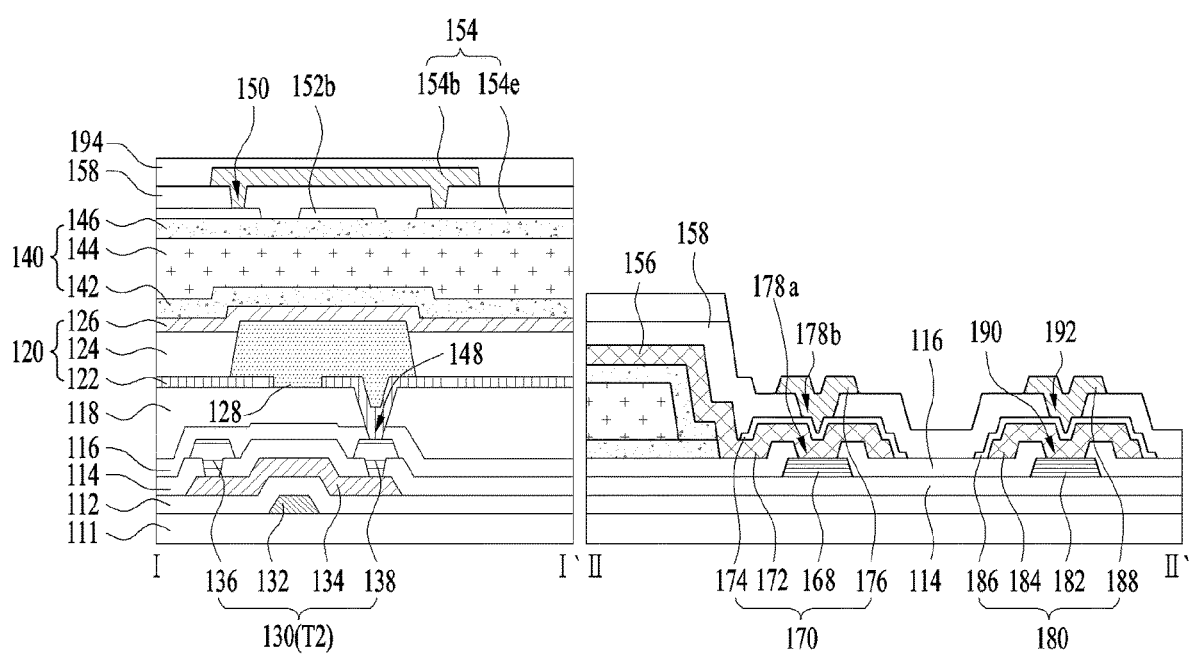
FIG. 3 is a sectional view illustrating the organic light emitting display with a touch sensor taken along the lines "I-I", and "II-II'" of FIG. 2 according to the first embodiment of the present disclosure.

As illustrated in FIG. 3, the driving thin film transistors (T2) 130 includes a gate electrode 132, a semiconductor layer 134 overlapping the gate electrode 132 via a gate insulating layer 112, and source electrode 136 and drain electrode 138 formed on an interlayer insulating layer 114 and contacting the semiconductor layer 134.

The light emitting device 120 is disposed in an active region of the substrate 111 and includes an anode 122, a light emitting stack 124 formed on the anode 122, and a cathode 126 formed on the light emitting stack 124.

The anode 122 is electrically connected to a drain electrode 138 of the driving thin film transistor 130 exposed through a pixel contact hole 148 passing through a planarization layer 118. The light emitting stack 124 is formed on the anode 122 of a light emission region provided by a bank 128. The light emitting stack 124 is formed by stacking a hole-related layer, an organic light emitting layer and an electron-related layer in order or reverse order on the anode 122. The cathode 126 faces the anode 122 via the light emitting stack 124.

The encapsulation part 140 blocks permeation of exterior moisture or oxygen into the light emitting device 120 that is vulnerable thereto. For this purpose, the encapsulation part 140 includes a plurality of inorganic encapsulation layers 142 and 146, and an organic encapsulation layer 144 interposed between the inorganic encapsulation layers 142 and 146, wherein the inorganic encapsulation layer 146 is disposed as an uppermost layer. In this case, the encapsulation part 140 includes at least two inorganic encapsulation layers 142 and 146, and at least one organic encapsulation layer 144. An example of the encapsulation part 140 having a structure in which the organic encapsulation layer 144 is disposed between the first and second inorganic encapsulation layers 142 and 146 will be described.

The first inorganic encapsulation layer 142 is formed on the substrate 111 provided with the cathode 126 such that it is the closest to the light emitting device 120. The first inorganic encapsulation layer 142 is formed using an inorganic insulating material that can be deposited at a low temperature, such as silicon nitride ($SiN_x$), silicon oxide ($SiO_x$), silicon oxycarbide (SiON) or aluminum oxide ($Al_2O_3$). Accordingly, since the first inorganic encapsulation layer 142 is deposited at a low temperature, it is possible to prevent damage to the organic light emitting layer of the light emitting stack 124 vulnerable to high temperatures upon deposition of the first inorganic encapsulation layer 142.

The organic encapsulation layer 144 functions as a buffer that reduces stress between the respective layers resulting from bending of the organic light emitting display and improves planarization performance. The organic encapsulation layer 144 is formed using an organic insulating material such as an acrylic resin, an epoxy resin, polyimide, polyethylene or silicon oxycarbide (SiOC).

The second inorganic encapsulation layer 146 is formed on the substrate 111 provided with the organic encapsulation layer 144 such that it covers the upper surfaces of the organic encapsulation layer 144. Accordingly, the second inorganic encapsulation layer 146 minimizes or prevents permeation of exterior moisture or oxygen into the organic encapsulation layer 144. The second inorganic encapsulation layer 146 is formed using an inorganic insulating material such as silicon nitride ($SiN_x$), silicon oxide ($SiO_x$), silicon oxynitride (SiON) or aluminum oxide ($Al_2O_3$).

As shown in FIGS. 2 and 3, a touch sensing line 154 and a touch driving line 152 are disposed on the encapsulation part 140 such that the touch sensing line 154 and the touch driving line 152 intersect each other via a touch insulating layer 158.

The touch driving line 152 includes a plurality of first touch electrodes 152e, and first bridges 152b for electrically connecting the first touch electrodes 152e to one another.

The first touch electrodes 152e are spaced from one another by a predetermined distance along an X or Y direction on the encapsulation part 140. Each of the first touch electrodes 152e is electrically connected to an adjacent first touch electrode 152e through the first bridge 152b.

The first bridge 152b is disposed on the encapsulation part 140 that is disposed on the same plane as the first touch electrode 152e and is electrically connected to the first touch electrode 152e without an additional contact hole. Because the first bridge 152b overlaps the bank 128, it is possible to prevent deterioration in the opening ratio by the first bridge 152b.

The touch sensing line 154 includes a plurality of second touch electrodes 154e and second bridges 154b for electrically connecting the second touch electrodes 154 to one another.

The second touch electrodes 154e are spaced from one another by a predetermined distance along a Y or X direction on the encapsulation part 140. Each of the second touch electrodes 154e is electrically connected to an adjacent second touch electrode 154e through a second bridge 154b.

The second bridge 154b is formed on the touch insulation layer 158 and is electrically connected to the second touch electrode 154e exposed by a touch sensor contact hole 150 passing through the touch insulation layer 158. Similar to the first bridge 152b, the second bridge 154b overlaps the bank 128, thus preventing deterioration in opening ratio by the second bridge 154b.

As such, the touch sensing lines 154 intersect one another via the touch driving line 152 and the touch insulation layer 158 to form mutual capacitance (Cm) at the intersection between the touch sensing line 154 and the touch driving line 152. Accordingly, mutual capacitance (Cm) functions as a touch sensor by charging an electric charge by a touch driving pulse supplied to the touch driving line 152 and discharging the charged electric charge to the touch sensing line 154.

Figure 4:
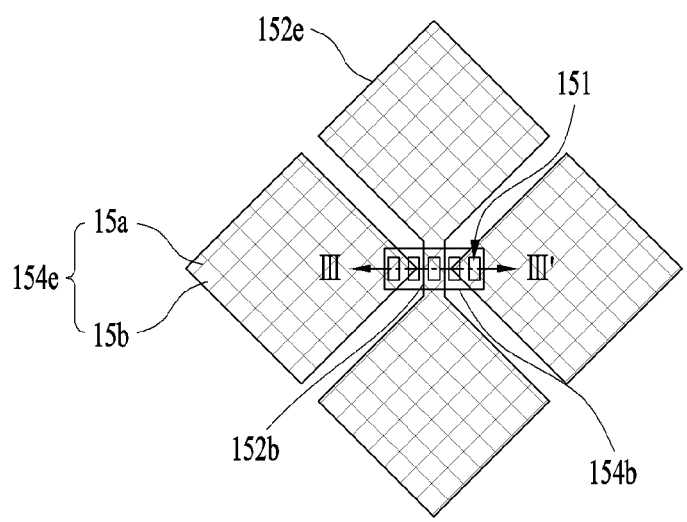
FIG. 4 is a plan view and a sectional view illustrating another embodiment of the touch electrode shown in FIGS. 2 and 3.
Figure 4:
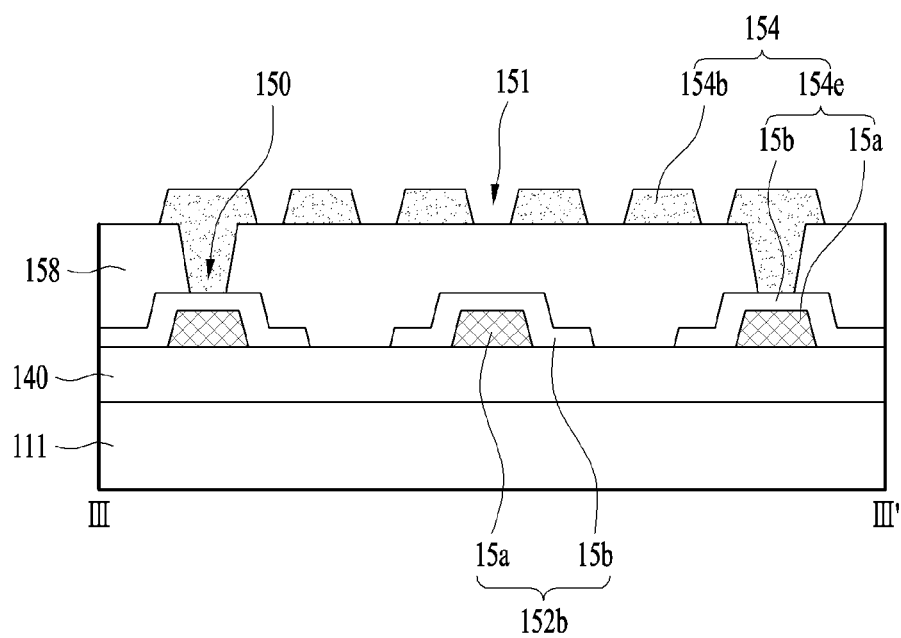

Meanwhile, each of the first and second touch electrodes 152e and 154e according to the present disclosure may be formed in the form of a plate as shown in FIG. 2 or in the form of a mesh as shown in FIG. 4. That is, the first and second touch electrodes 152e and 154e shown in FIG. 4 include a transparent conductive layer 15b, and a mesh metal layer 15a formed in the form of a mesh on or under the transparent conductive layer 15b. The mesh metal layer 15a is formed by the same mask process as the routing line 156 using the same material as the routing line 156. Accordingly, it is possible to prevent complication of the manufacturing process and an increase in manufacturing costs resulting from the mesh metal layer 15a.

Furthermore, the touch electrodes 152e and 154e may be composed of only the mesh metal layer 15a without the transparent conductive layer 15b, or may be formed of the transparent conductive layer 15b in the form of a mesh without the mesh metal layer 15a. Here, because the touch electrodes 152e and 154e including the mesh metal layer 15a such as Al, Ti, Cu or Mo have better conductivity than touch electrodes 152e and 154e including the transparent conductive layer 15b such as ITO or IZO, the touch electrodes 152e and 154e can be formed as low-resistance electrodes. Accordingly, touch sensitivity can be improved due to decreased resistance and capacitance of the touch electrodes 152e and 154e, and thus reduced RC time constant. In addition, it is possible to prevent deterioration in the opening ratio and transmittance due to very small line width of the mesh metal layer 1542. In addition, as shown in FIG. 4, the second bridge 154b, which is disposed in a different plane from the touch electrodes 152e and 154e and includes a non-transparent conductive layer, includes a plurality of slits 151. Accordingly, the second bridge 154b including the slits 151 can reduce an area as compared to a bridge including no slit 151. Accordingly, it is possible to reduce reflection of exterior light by the second bridge 154b and thus prevent deterioration of visibility. The second bridge 154b including the slits 151 overlaps the bank 128, thereby preventing deterioration of opening ratio by the second bridge 154b including a non-transparent conductive layer.

The touch driving line 152 and the touch sensing line 154 according to the present disclosure are connected to a touch driving part (not shown) through a routing line 156 and a touch pad 170 disposed in a non-active (bezel) region.

Accordingly, the routing line 156 transmits a touch driving pulse generated in the touch driving part through the touch pad 170 to the touch driving line 152, and transmits a touch signal from the touch sensing line 154 to the touch pad 170. The routing line 156 is disposed between each of the first and second touch electrodes 152e and 154e, and the touch pad 170, and is electrically connected to each of the first and second touch electrodes 152e and 154e, without an additional contact hole.

As shown in FIG. 2, the routing line 156 connected to the first touch electrode 152e extends along at least one of upper and lower sides of an active region and is connected to the touch pad 170. The routing line 156 connected to the second touch electrode 154e extends along at least one of left and right sides of the active region and is connected to the touch pad 170. Meanwhile, the disposition of the routing line 156 is not limited to the structure shown in FIG. 2 and is variably changed depending on the design specifications of the display.

The routing line 156 is formed as a monolayer or multi-layer structure using a first conductive layer with excellent corrosion resistance, acid resistance and conductivity, such as Al, Ti, Cu or Mo. For example, the routing line 156 is formed as a three-layer stack structure such as Ti/Al/Ti or Mo/Al/Mo, or is formed as a multilayer structure including a transparent conductive layer with excellent corrosion resistance and acid resistance, such as ITO or IZO, and a non-transparent conductive layer with excellent conductivity, such as Ti/Al/Ti or Mo/Al/Mo.

The touch pad 170 includes a touch auxiliary electrode 168, first touch pad electrodes 172 and second touch pad electrodes 174, and a touch cover electrode 176.

The touch auxiliary electrode 168 is formed on the same plane as source and drain electrodes 136 and 138 using the same material as the source and drain electrodes 136 and 138 of the driving transistor (T2) 130. That is, the touch auxiliary electrode 168 is formed on the interlayer insulating layer 114 using the same material as the source and drain electrodes 136 and 138.

The first touch pad electrode 172 extends from the routing line 156 and is formed using the same material as the routing line 156. The first touch pad electrode 172 is electrically connected to the touch auxiliary electrode 168 exposed through the first touch pad contact hole 178a passing through the protective layer 116.

The second touch pad cover electrode 174 is formed using the same material as the first and second touch electrodes 152e and 154e. The second touch pad electrode 174 is formed to cover the first touch pad electrode 172, so that it can be directly connected to the first touch pad electrode 172 without an additional contact hole.

As shown in FIG. 3, in one embodiment the touch pad electrodes 172, 174 are directly connected to the touch auxiliary electrode 168 and the touch cover electrode 176. In another embodiment, the touch pad electrodes 172, 174 are not directly connected to the touch auxiliary electrode 168 and the touch cover electrode 176. Rather, the touch pad electrodes are horizontally shifted (e.g., to the left) and are not directly connected to the touch auxiliary electrode 168. In this alternative embodiment, a first contact hole exposes a portion of the touch auxiliary electrode 168 and a second contact hole exposes a portion of the touch pad electrodes 172, 174 that are horizontally shifted away from the touch auxiliary electrode 168. The touch cover electrode 176 is electrically connected to the touch auxiliary electrode 168 via the touch pad electrodes 172,174 in the alternative embodiment.

The touch cover electrode 176 is disposed on the same plane as the conductive layer included in the touch sensor using the same manner material as the conductive layer. For example, the display cover electrode 188 is formed on the touch insulating layer 158, which is disposed on the same plane as the second bridge 154b, using the same material as the second bridge 154b, which is disposed as the uppermost layer of the touch tensor. The touch cover electrode 176 is electrically connected to the second touch pad electrode 174 exposed by the second pad contact hole 178b passing through the touch insulating layer 158. The touch cover electrode 176 is formed to be exposed by the touch barrier layer 194, so that it can be connected to a signal transmission layer provided with the touch driving part. Here, the touch barrier layer 194 is formed to cover the touch sensing line 154 and the touch driving line 152, thereby preventing damage to the light emitting device 120 as well as the touch sensing line 154 and the touch driving line 152 by exterior moisture or the like. The touch barrier layer 194 is formed by coating an organic insulating layer with an inorganic insulating layer. An optical layer (not shown) such as a circular polarizer or brightness improvement film (OLED transmittance controllable film; OTF) may be disposed on the touch barrier layer 194.

Meanwhile, the touch pad 170 and the display pad 180 are disposed in a non-active (bezel) region. As shown in FIG. 2, the touch pad 170 and the display pad 180 may be disposed in at least one of one and second sides of the substrate 111, or the touch pad 170 and the display pad 180 may be disposed in different regions. Meanwhile, the disposition of the touch pad 170 and the display pad 180 is not limited to the structure shown in FIG. 2 and can be variably changed depending on design specifications of the display. As such, the display pad 180 disposed with the touch pad 170 in the non-active region has the same stack structure as the touch pad 170. In this case, since the touch cover electrode 176 and the display cover electrode 188 respectively disposed as the uppermost layers of the touch pad 170 and the display pad 180 are disposed on the same plane as each other, processes of adhering signal transmission layers can be simultaneously performed and the overall process can thus be simplified. The display pad 180 includes a display pad electrode 182, at least one layer of display auxiliary electrodes 184 and 186 and a display cover electrode 188.

The display pad electrode 182 extends from at least one signal line of a scan line (SL), a data line (DL) and a high-voltage power (VDD) line in an active region in which the light emitting device 120 is formed. The display pad electrode 182 is formed as a monolayer or a multilayer structure on the same plane as at least one of the gate electrode 132 of the driving transistor (T2) 130, and source and drain electrodes 136 and 138, using the same material as at least one of the gate electrode 132 of the driving transistor (T2) 130, and the source and drain electrodes 136 and 138. That is, the display pad electrode 182 having a monolayer structure is formed on the interlayer insulating layer 114 using the same material as the source and drain electrodes 136 and 138, or is formed on the substrate 111 using the same material as the gate electrode 132. The display pad electrode 182 having a multilayer structure includes a first display pad electrode (not shown) formed on the substrate 111 using the same material as the gate electrode 132, and a second display pad electrode (not shown) which is connected to the first display pad electrode and is formed on the interlayer insulating layer 114 using the same material as source and drain electrodes 136 and 138.

The first display auxiliary electrode 184 is formed on the same plane as the routing line 156 using the same material as the routing line 156. The first display auxiliary electrode 184 is electrically connected to the display pad electrode 182 exposed by the display pad contact hole 190 passing through the protective layer 116.

The second display auxiliary electrode 186 is formed using the same material as the first and second touch electrodes 152e and 154e. The second display auxiliary electrode 186 covers the first display auxiliary electrode 184 and is thus directly connected to the first display auxiliary electrode 184 without an additional contact hole.

As shown in FIG. 3, in one embodiment the display auxiliary electrode is directly connected to the display pad electrode 182 and the display cover electrode 188. In another embodiment, the display auxiliary electrode is not directly connected to the display pad electrode 182. Rather, the display auxiliary electrode is horizontally shifted (e.g., to the right) and is not overlapped by the display pad electrode 182 and the display cover electrode 188. In this alternative embodiment, a first contact hole exposes a portion of the display pad electrode 182 and a second contact hole exposes a portion of the display auxiliary electrode that is horizontally shifted away from the display pad electrode 182. The display cover electrode 188 is electrically connected to the display pad electrode 182 via the display auxiliary electrode in the alternative embodiment.

The display cover electrode 188 is formed on the touch insulating layer 158 that is on the same plane as the second bridge 154b using the same material as the second bridge 154b. The display cover electrode 188 is electrically connected to the second display auxiliary electrode 186 exposed by the second display pad contact hole 192 passing through the touch insulating layer 158.

FIGS. 5A to 5E are a plan view and sectional views illustrating a method of manufacturing the organic light emitting display with a touch sensor shown in FIG. 3.

Figure 5A:
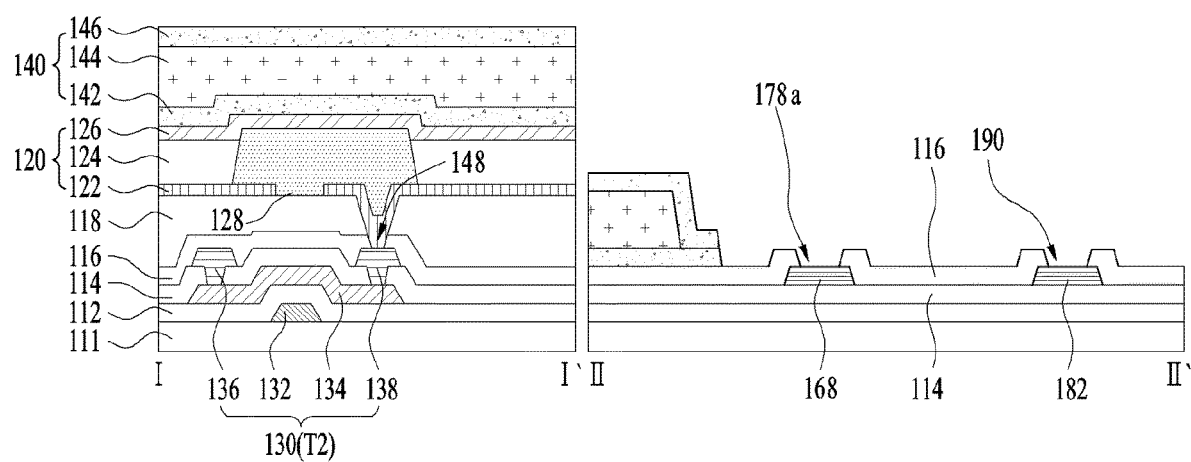
FIGS. 5A to 5E are sectional views illustrating a method of manufacturing the organic light emitting display with a touch sensor according to the first embodiment of the present disclosure.

Referring to FIG. 5A, a substrate 111 provided with a switching transistor, a driving transistor (T2) 130, a light emitting device 120 and a encapsulation part 140 is provided.

Specifically, a touch auxiliary electrode 168, a display pad electrode 182, the switching transistor and the driving transistor (T2) 130 are formed on the substrate 111 by a plurality of mask processes. Here, the touch auxiliary electrode 168 and the display pad electrode 182 are simultaneously formed with the source and drain electrodes 136 and 138 of the driving transistor (T2) 130 using the same mask process. Thus, the touch auxiliary electrode 168 and the display pad electrode 182 are made of a same material as the source and drain electrodes 136 and 138 of the driving transistor (T2) 130. Furthermore, the display pad electrode 182 may be simultaneously formed with the gate electrode (132) of the driving transistor (T2) 130 using the same mask process.

Then, a protective layer 116 and a planarization layer 118 are formed over the entire surface of the resulting structure to cover the touch auxiliary electrode 168, the display pad electrode 182, the switching transistor and the driving transistor (T2) 130, and are then patterned by photolithography and etching to form a pixel contact hole 148, a first touch pad contact hole 178a and a first display pad contact hole 190 passing through the protective layer 116 and the planarization layer 118. Then, an anode 122, a bank 128, a light emitting stack 124 and a cathode 126 are sequentially formed on the planarization layer 118. Inorganic encapsulation layers 142 and 146 and an organic encapsulation layer 144 are sequentially stacked on the substrate 111 provided with the cathode 126, thereby forming a encapsulation part 140.

Figure 5B:
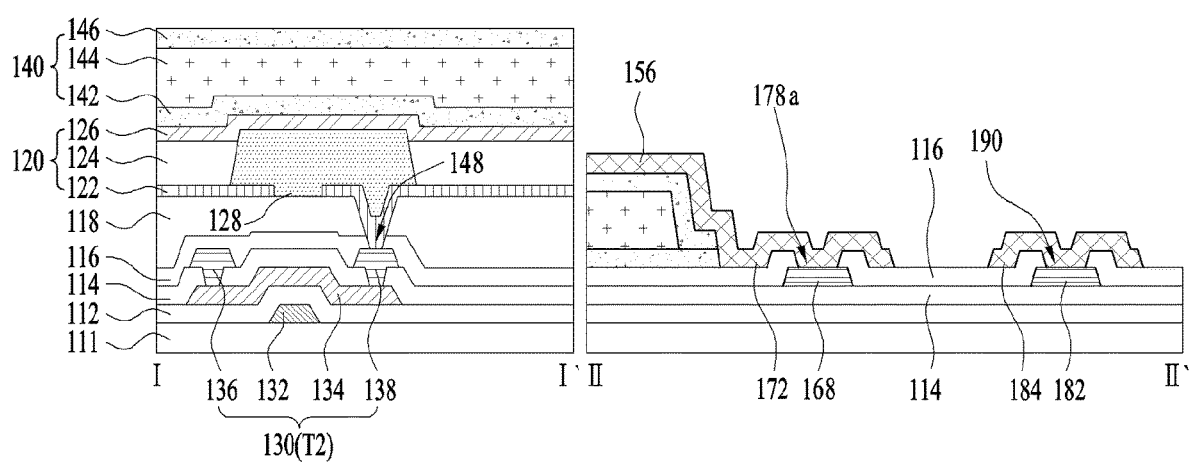

Referring to FIG. 5B, a routing line 156, a first touch pad electrode 172 and a first display auxiliary electrode 184 are formed on the substrate 111 provided with the encapsulation part 140.

Specifically, the first conductive layer is deposited at room temperature by deposition using sputtering over the entire surface of the substrate 111 provided with the encapsulation part 140 and is then patterned by photolithography and etching to form a routing line 156, a first touch pad electrode 172 and a first display auxiliary electrode 184. Here, the first conductive layer is formed as a monolayer or multilayer structure using a metal with excellent corrosion resistance and acid resistance such as Al, Ti, Cu or Mo. For example, the first conductive layer is formed as a three-layer stack structure such as Ti/Al/Ti or Mo/Al/Mo. The first display auxiliary electrode 184 prevents exposure of the display pad electrode 182, thus preventing damage to the display pad electrode 182 upon formation of the routing line 156, the first and second touch electrodes 152e and 154e and the first and second bridges 152b and 154b.

Figure 5C:
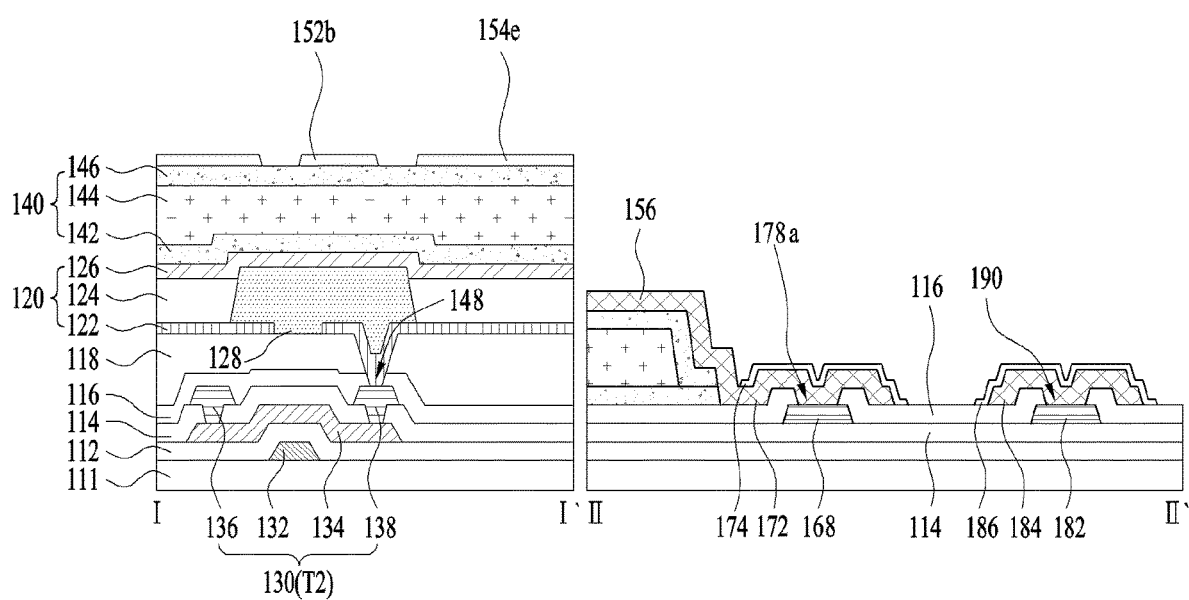

Referring to FIG. 5C, first and second touch electrodes 152e and 154e, a first bridge 152b, a second touch pad electrode 174 and a second display auxiliary electrode 186 are formed on the substrate 111 provided with the routing line 156, the first touch pad electrode 172 and the first display auxiliary electrode 184.

Specifically, the second conductive layer is deposited over the entire surface of the substrate 111 provided with the routing line 156 and the first touch pad electrode 172. Here, in a case in which a transparent conductive layer such as ITO or IZO is used as the second conductive layer, the transparent conductive layer is formed at room temperature by deposition such as sputtering. Then, the second conductive layer is patterned by photolithography and etching to form the first and second touch electrodes 152e and 154e, the first bridge 152b, the second touch pad electrode 174 and the second display auxiliary electrode 186.

Figure 5D:
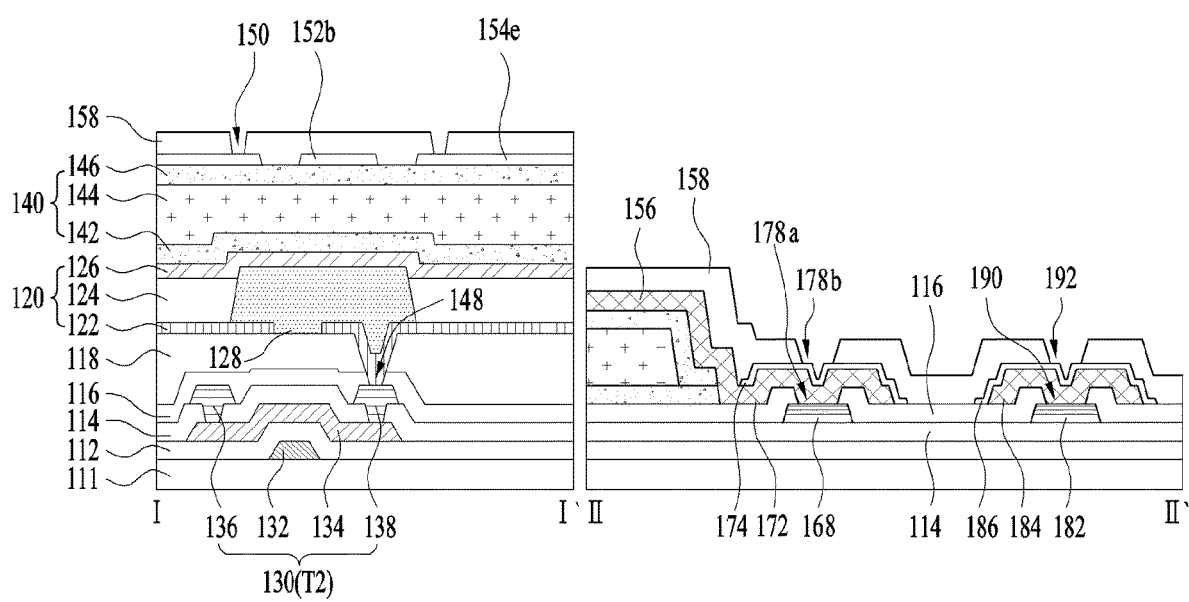

Referring to FIG. 5D, a touch insulation layer 158 having a touch sensor contact hole 150, a second touch pad contact hole 178b and a second display pad contact hole 192 is formed on the substrate 111 provided with the first and second touch electrodes 152e and 154e, the first bridge 152b, the second touch pad electrode 174 and the second display auxiliary electrode 186.

Specifically, a touch insulation layer 158 is formed to a thickness of 500 Å to 5 μm on the substrate 111 provided with the first and second touch electrodes 152e and 154e, the first bridge 152b and the second touch pad electrode 174. Here, in a case in which an organic layer is used as the touch insulation layer 158, the organic layer is coated on the substrate and is then cured at a temperature of 100 degrees or less in order to prevent damage to the light emitting stack 124 vulnerable to high temperatures, to form the touch insulation layer 158. In a case in which an inorganic layer is used as the touch insulation layer 158, low-temperature CVD deposition and washing processes were repeated at least twice in order to prevent damage to the light emitting stack 124 vulnerable to high temperatures to form a touch insulation layer 158 with a multilayer structure. Then, the touch insulation layer 158 is patterned by photolithography and etching to form a touch insulating layer 158 including a touch sensor contact hole 150, a second touch pad contact hole 178b and a second display pad contact hole 192.

Figure 5E:
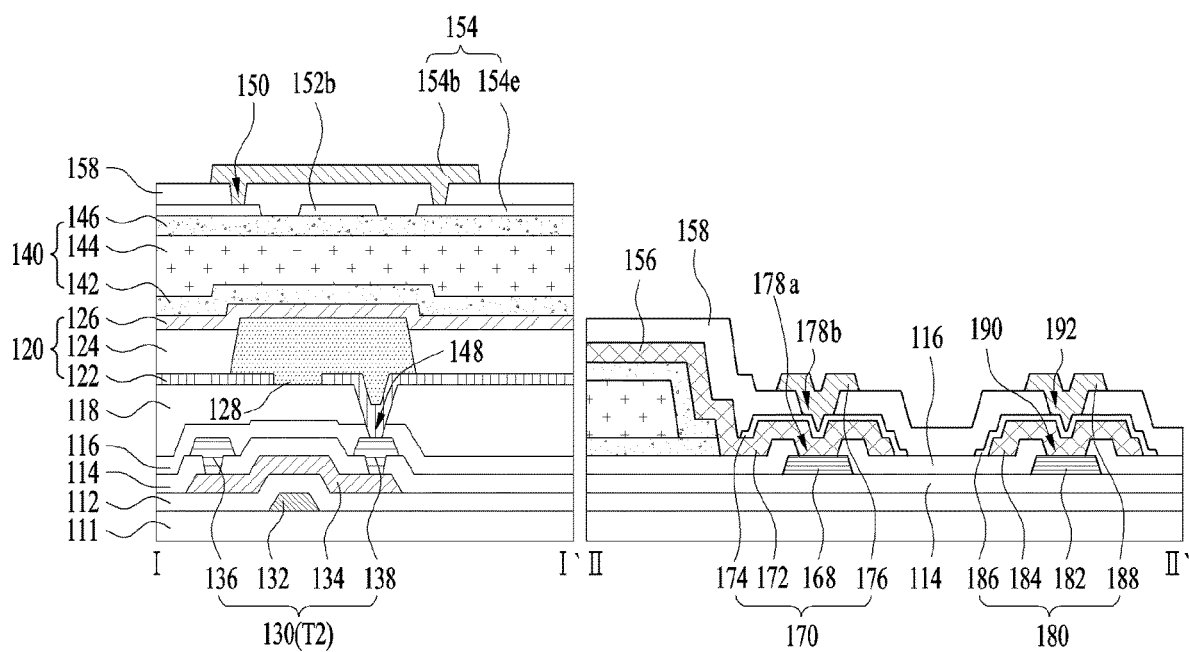

Referring to FIG. 5E, a second bridge 154b, a touch cover electrode 176 and a display cover electrode 188 are formed on the substrate 111 provided with the touch insulation layer 158 having a touch sensor contact hole 150, a touch pad contact hole 178 and a display pad contact hole 190.

Specifically, a third conductive layer is formed on the substrate 111 provided with the touch insulation layer 158 having the touch sensor contact hole 150, the second touch pad contact hole 178b and the second display pad contact hole 192. Here, in a case in which a transparent conductive layer such as ITO or IZO, or a metal with excellent corrosion resistance and acid resistance such as Al, Ti, Cu or Mo is used as the third conductive layer, the third conductive layer is formed at room temperature by deposition such as sputtering. Then, the third conductive layer is patterned by photolithography and etching to form a second bridge 154b, a touch cover electrode 176 and a display cover electrode 188. Then, a touch barrier layer 194 and an optical film are attached to the substrate 111 provided with the second bridge 154b, the pad cover electrode 176 and the display cover electrode 188, as shown in FIG. 3.

The organic light emitting display with a touch sensor according to the first embodiment of the present invention has a structure in which the touch electrodes 152e and 154e are directly disposed on the encapsulation part 140. Accordingly, as compared to a conventional organic light emitting display in which a touchscreen is directly attached to the organic light emitting display by an adhesive agent, the present disclosure does not require an adhesion process, thus simplifying a manufacturing process and reducing manufacture costs.

In addition, the organic light emitting display with a touch sensor according to the first embodiment of the present disclosure has a structure in which the first display auxiliary electrode 184 formed using the same mask process as the routing line 156, the second display auxiliary electrode 186 formed using the same mask process as the first and second touch electrodes 152e and 154e, and the display cover electrode 188 formed using the same mask process as the second bridge 154b are each disposed on the display pad electrode 182. In this case, it is possible to prevent exposure of the display pad electrode 182 during manufacture of each of the routing line 156, the first and second touch electrodes 152e and 154e, and the second bridge 154b. Accordingly, it is possible to prevent damage to the display pad electrode 182 by an etching gas or liquid used for manufacturing the routing line 156, the first and second touch electrodes 152e and 154e and the second bridge 154b.

Figure 6:
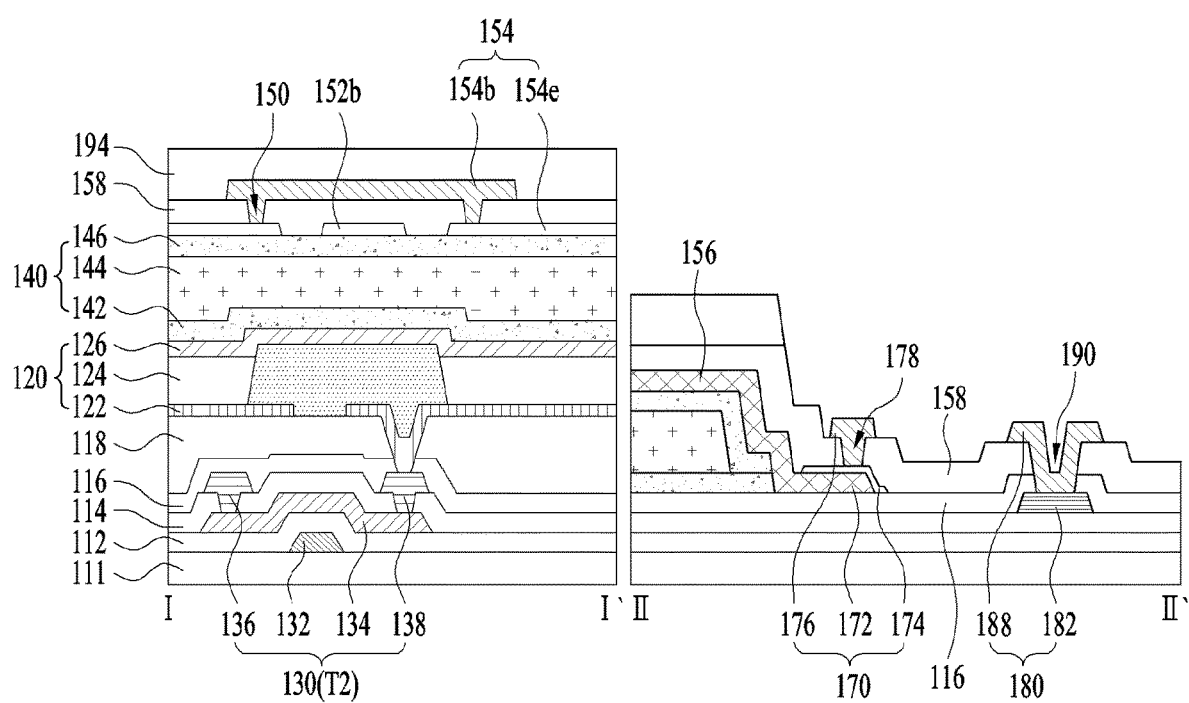
FIG. 6 is a sectional view illustrating the organic light emitting display with a touch sensor according to a second embodiment of the present disclosure.

FIG. 6 is a sectional view illustrating an organic light emitting display with a touch sensor according to a second embodiment of the present disclosure.

The organic light emitting display illustrated in FIGS. 6 and 7 includes the same elements as the organic light emitting display according to the first embodiment of the present invention, except that the stack structures of the touch pad 170 and the display pad 180 are different. Accordingly, detailed description of the same elements will be omitted.

The display pad 180 includes a display pad electrode 182 and a display cover electrode 188.

The display pad electrode 182 extends from at least one signal line of a scan line (SL), a data line (DL) and a high-voltage power (VDD) line in an active region in which the light emitting device 120 is formed. The display pad electrode 182 is formed as a monolayer or a multilayer structure on the same plane as at least one of the gate electrode 132 of the driving transistor (T2) 130, and source and drain electrodes 136 and 138, using the same material as at least one of the gate electrode 132 of the driving transistor (T2) 130, and the source and drain electrodes 136 and 138. That is, the display pad electrode 182 having a monolayer structure is formed on the interlayer insulating layer 114 using the same material as the source and drain electrodes 136 and 138, or is formed on the substrate 111 using the same material as the gate electrode 132. The display pad electrode 182 having a multilayer structure includes a first display pad electrode (not shown) formed on the substrate 111 using the same material as the gate electrode 132, and a second display pad electrode (not shown) which is connected to the first display pad electrode on the interlayer insulating layer 114 and is formed using the same material as source and drain electrodes 136 and 138.

The display cover electrode 188 is disposed on the same plane as the conductive layer included in the touch sensor using the same material as the conductive layer. For example, the display cover electrode 188 is formed on the touch insulating layer 158 that is formed on the same plane as the second bridge 154b using the same material as the second bridge 154b disposed as the uppermost layer of the touch sensor. The display cover electrode 188 is electrically connected to the display pad electrode 182 exposed by the display pad contact hole 190 passing through the protective layer 116 and the touch insulating layer 158. Meanwhile, although, in the present disclosure, a structure in which the protective layer 116 and the touch insulating layer 158 are disposed on the display pad electrode has been illustrated, at least one of a lower insulating layer disposed under the light emitting device and an upper insulating layer disposed on the light emitting device is disposed on the display pad electrode 182. Here, the lower insulating layer is any one of the protective layer 116 and the planarization layer 118, and the upper insulating layer is any one of the first and second inorganic encapsulation layers 142 and 146, the organic encapsulation layer 144 and the touch insulating layer 158. In this case, the display pad contact hole 190 passes through at least one of the upper insulating layer and the lower insulating layer disposed on the display pad electrode 182.

The touch pad 170 includes at least one layer of touch pad electrodes 172 and 174 and a touch cover electrode 176.

The first touch pad electrode 172 extends from the routing line 156 and is formed using the same material as the routing line 156.

The second touch pad electrode 174 is formed using the same material as the first and second touch electrodes 152e and 154e. The second touch pad electrode 174 covers the first touch pad electrode 172 and is directly connected to the first touch pad electrode 172 without an additional contact hole.

The touch cover electrode 176 is formed on the touch insulating layer 158 that is disposed on the same plane as the second bridge 154b using the same material as the second bridge 154b. The touch cover electrode 176 is electrically connected to the second touch pad electrode 174 exposed by the touch pad contact hole 178 passing through the touch insulating layer 158.

The touch cover electrode 176 is exposed by the touch barrier layer 194 and is thus connected to a signal transmission layer provided with the touch driving part, and the display cover electrode 188 is exposed by the touch barrier layer 194 and is thus connected to a signal transmission layer provided with the display driving part (for example, gate driving part and data driving part). Here, the touch barrier layer 194 covers the touch sensing line 154 and the touch driving line 152, thereby preventing damage to the light emitting device 120 as well as the touch sensing line 154 and the touch driving line 152 by exterior moisture. The touch barrier layer 194 is formed by coating an organic insulating layer with an inorganic insulating layer.

An optical film (not shown) such as a circular polarizer or a brightness improvement film (OLED transmittance controllable film; OTF) may be disposed on the touch barrier layer 194.

FIGS. 7A to 7E are a plan view and sectional views illustrating a method of manufacturing the organic light emitting display with a touch sensor shown in FIG. 6.

Figure 7A:
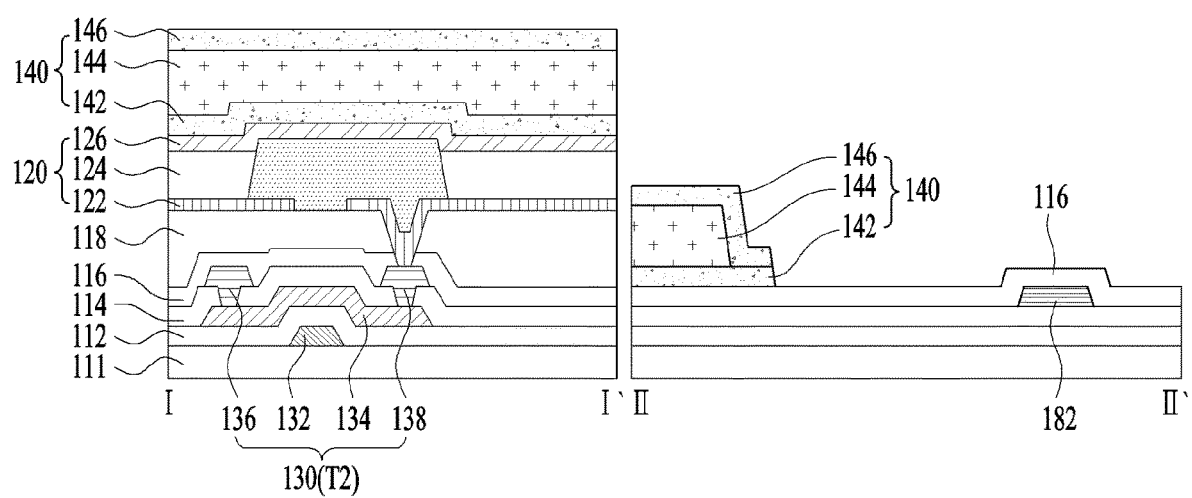
FIGS. 7A to 7E are sectional views illustrating a method of manufacturing the organic light emitting display with a touch sensor according to the second embodiment of the present disclosure.

Referring to FIG. 7A, a substrate 111 provided with a switching transistor, a driving transistor (T2) 130, a light emitting device 120 and a encapsulation part 140 is provided.

Specifically, a display pad electrode 182, a switching transistor, a driving transistor (T2) 130 and a light emitting device 120 are formed on the substrate 111 by a plurality of mask processes. At this time, the display pad electrode 182 is simultaneously formed with the source and drain electrodes 136 and 138 of the driving transistor (T2) 130 using the same mask process as the source and drain electrodes 136 and 138. Furthermore, the display pad electrode 182 may be simultaneously formed with the gate electrode 132 of the driving transistor (T2) 130 using the same mask process as the gate electrode 132. Then, inorganic encapsulation layers 142 and 146 and an organic encapsulation layer 144 are sequentially stacked on the substrate 111 provided with the light emitting device 120, thereby forming the encapsulation part 140.

Figure 7B:
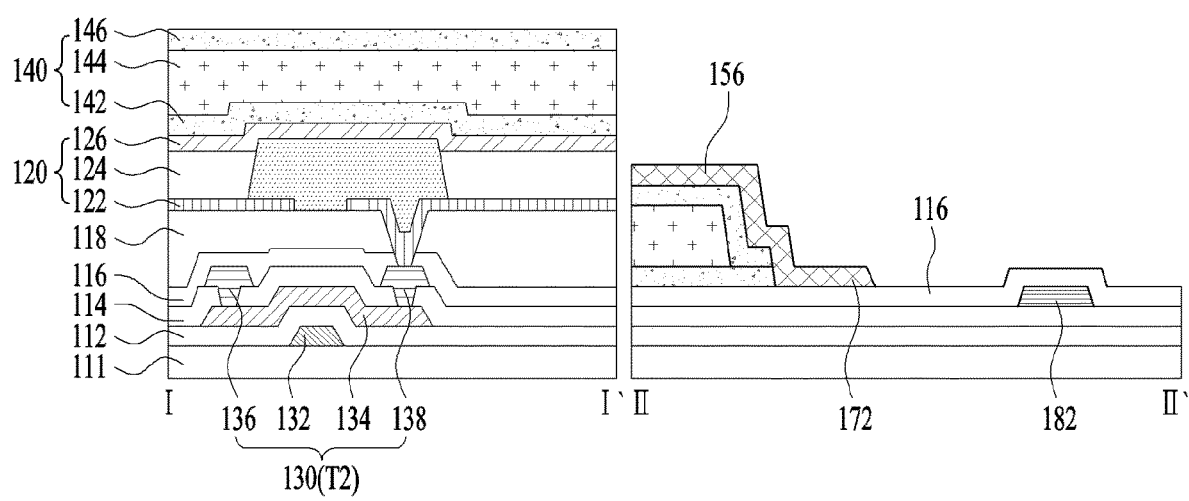

Referring to FIG. 7B, a routing line 156 and a first touch pad electrode 172 are formed on the substrate 111 provided with the encapsulation part 140.

Specifically, the first conductive layer is deposited at room temperature by deposition using sputtering over the entire surface of the substrate 111 provided with the encapsulation part 140, and is then patterned by photolithography and etching to form a routing line 156 and a first touch pad electrode 172. Here, the first conductive layer is formed as a monolayer or multilayer structure using a metal with excellent corrosion resistance and acid resistance, such as Al, Ti, Cu or Mo. For example, the first conductive layer is formed as a three-layer stack structure such as Ti/Al/Ti or Mo/Al/Mo.

Figure 7C:
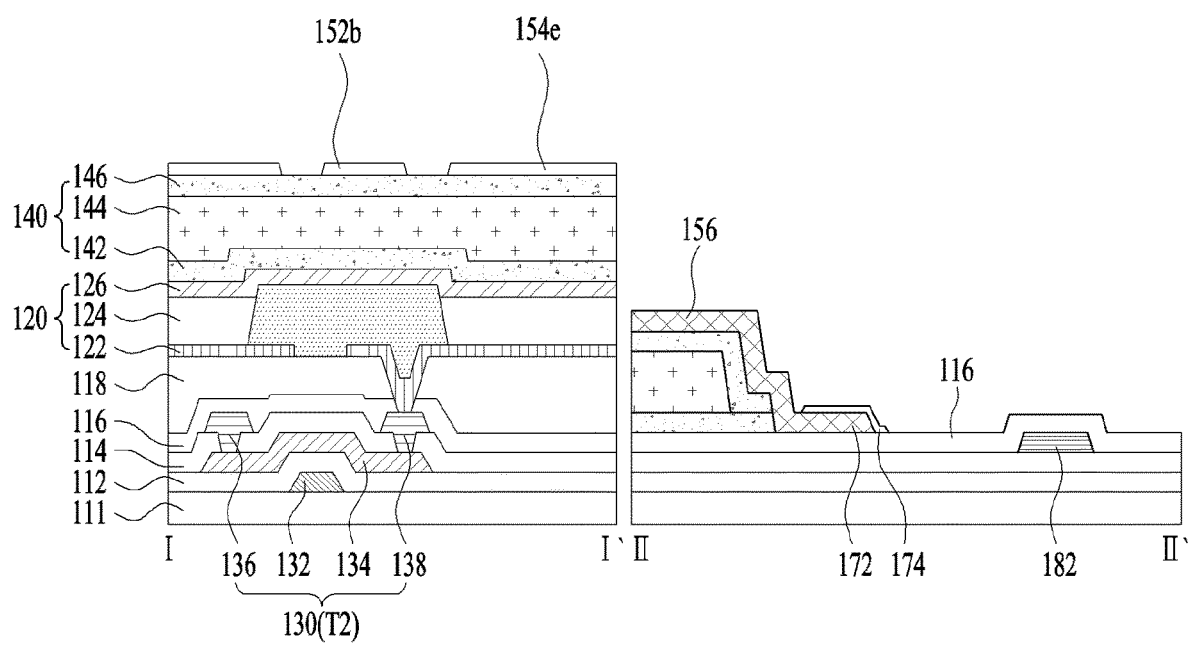

Referring to FIG. 7C, first and second touch electrodes 152e and 154e, a first bridge 152b and a second touch pad electrode 174 are formed on the substrate 111 provided with the routing line 156 and the first touch pad electrode 172.

Specifically, the second conductive layer is deposited over the entire surface of the substrate 111 provided with the routing line 156 and the first touch pad electrode 172. Here, in a case in which a transparent conductive layer such as ITO or IZO is used as the second conductive layer, the transparent conductive layer is formed at room temperature by deposition such as sputtering. Then, the second conductive layer is patterned by photolithography and etching to form first and second touch electrodes 152e and 154e, a first bridge 152b and a second touch pad electrode 174.

Figure 7D:
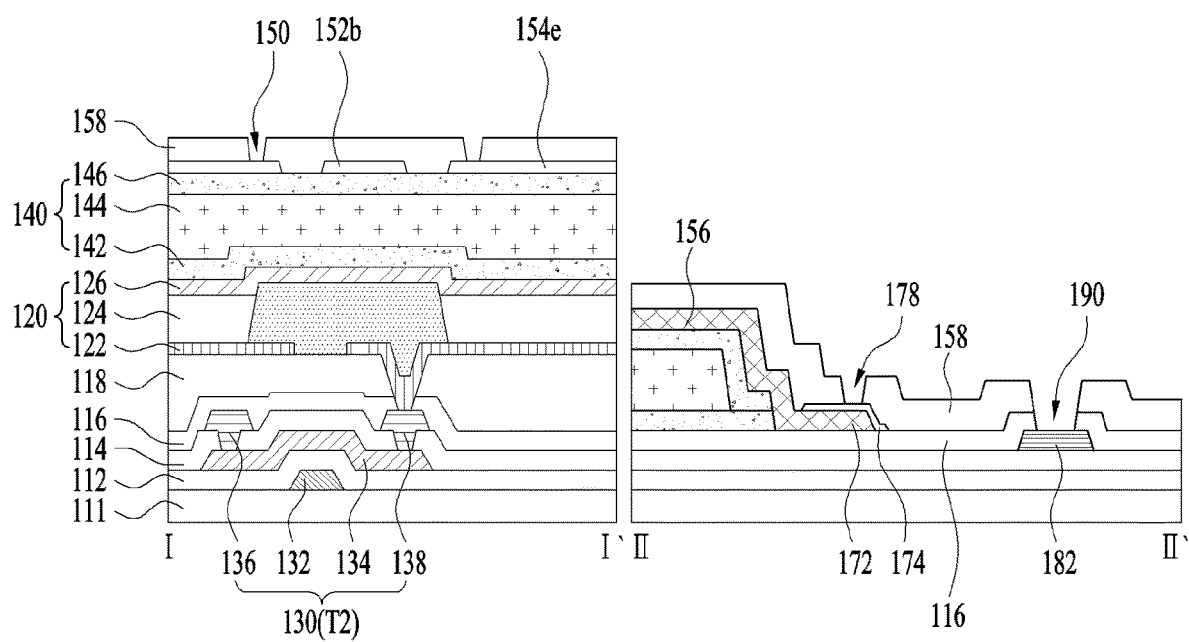

Referring to FIG. 7D, a touch insulating layer 158 including a touch sensor contact hole 150, a touch pad contact hole 178 and a display pad contact hole 190 is formed on the substrate 111 provided with the first and second touch electrodes 152e and 154e, the first bridge 152b and the second touch pad electrode 174.

Specifically, a touch insulation layer 158 is formed to a thickness of 500 Å to 5 μm by deposition or coating on the substrate 111 provided with the first and second touch electrodes 152e and 154e, the first bridge 152b and the second touch pad electrode 174. Here, in a case in which an organic layer is used as the touch insulation layer 158, the organic layer is coated on the substrate and is then cured at a temperature of 100 degrees or less, thereby forming the touch insulating layer 158. In a case in which an inorganic layer is used as the touch insulation layer 158, low-temperature CVD deposition and washing processes were repeated at least twice, to form a touch insulation layer 158 with a multilayer structure. Then, the touch insulating layer 158 and the protective layer 116 are patterned by photolithography and etching to form a touch sensor contact hole 150, a touch pad contact hole 178 and a display pad contact hole 190. The touch sensor contact hole 150 passes through the touch insulating layer 158 to expose the second touch electrode 154e. The touch pad contact hole 178 passes through the touch insulating layer 158 to expose the second touch pad electrode 174. The display pad contact hole 190 passes through the protective layer 116 and the touch insulating layer 158 to expose the display pad electrode 182.

Meanwhile, during formation of the touch sensor contact hole 150, the touch pad contact hole 178 and the display pad contact hole 190, the mesh-type metal layer 15a of the touch electrodes 152e and 154e is protected by a transparent conductive layer 15b of the touch electrodes 152e and 154e, as shown in FIG. 4, to prevent an etching gas from damaging the mesh-type metal layer 15a.

Figure 7E:
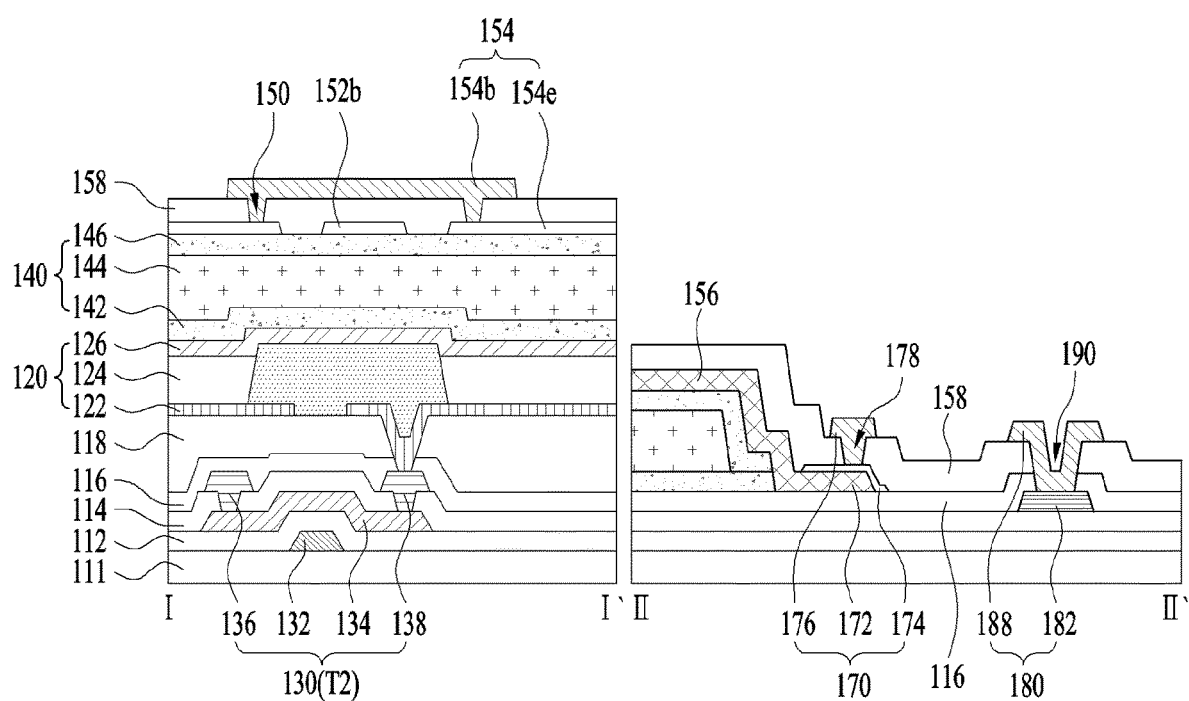

Referring to FIG. 7E, a second bridge 154b, a touch cover electrode 176 and a display cover electrode 188 are formed on the substrate 111 provided with the touch insulating layer 158 including the touch sensor contact hole 150, the touch pad contact hole 178 and the display pad contact hole 190.

Specifically, a third conductive layer is formed on the substrate 111 provided with the touch insulating layer 158 including the touch sensor contact hole 150, the touch pad contact hole 178 and the display pad contact hole 190. Here, in a case in which a transparent conductive layer such as ITO or IZO, or a metal with excellent corrosion resistance and acid resistance such as Al, Ti, Cu or Mo is used as the third conductive layer, the third conductive layer is formed at room temperature by deposition such as sputtering. Then, the third conductive layer is patterned by photolithography and etching to form a second bridge 154b, a touch cover electrode 176 and a display cover electrode 188. Then, a touch barrier layer 194 and an optical film are attached to the substrate 111 provided with the second bridge 154b, the pad cover electrode 176 and the display cover electrode 188.

As such, the organic light emitting display with a touch sensor according to the second embodiment of the present disclosure has a structure in which touch electrodes 152e and 154e are directly disposed on the encapsulation part. Accordingly, as compared to a conventional organic light emitting display in which a touchscreen is directly attached to the organic light emitting display by an adhesive agent, the present disclosure does not require an adhesion process, thus simplifying a manufacturing process and reducing manufacturing costs.

In addition, regarding the organic light emitting display with a touch sensor according to the second embodiment of the present disclosure, the display pad contact hole 190 exposing the display pad electrode 182 is simultaneously formed with the touch pad contact hole 178 exposing the touch pad electrodes 172 and 174. Accordingly, according to the present disclosure, the display pad contact hole can be formed without an additional mask process.

In addition, according to the present disclosure, during formation of the routing line 156 and the first and second touch electrodes 152e and 154e, the display pad electrode 182 is protected by the pad insulating layer including the protective layer 116 and the touch insulating layer 158, thus preventing the display pad electrode 182 from being exposed to the outside until the display pad contact hole 190 is formed. Accordingly, it is possible to prevent damage to the display pad electrode 182, in particular, decrease in thickness of the display pad electrode 182, by an etching gas or liquid used for formation of the routing line 156 and the first and second touch electrodes 152e and 154e.

Figure 8A:
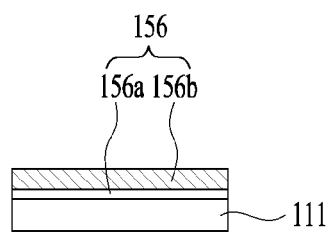
FIGS. 8A and 8B are sectional views illustrating other embodiments of the routing line shown in FIG. 6.
Figure 8B:
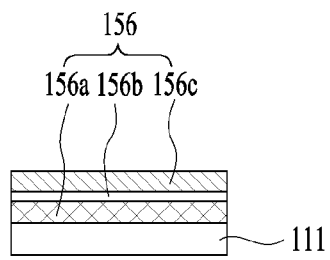

Meanwhile, although an example in which the routing line 156 of the organic light emitting display according to the present disclosure is formed using a different mask process from the touch electrodes 152e and 154e and bridges 152b and 154b has been illustrated as shown in FIG. 3, the touch electrodes 152e and 154e and the bridges 152b and 154b may be formed using the same mask process, as shown in FIGS. 8A and 8B. That is, as shown in FIG. 8A, the routing line 156 includes a first routing layer 156a formed using the same mask process as the touch electrodes 152e and 154e, and a second routing layer 156b formed using the same mask process as the second bridge 154b. In this case, the first routing layer 156a is formed using the same material as the touch electrodes 152e and 154e, and the second routing layer 156b is formed using the same material as the second bridge 154b. In addition, as shown in FIG. 8B, the routing line 156 includes a first routing layer 156c including a first conductive layer, a second routing layer 156b formed using the same mask process as the touch electrodes 152e and 154e, and a third routing layer 156c formed using the same mask process as the second bridge 154b. In this case, the second routing layer 156b is formed using the same material as the touch electrodes 152e and 154e and the third routing layer 156c is formed using the same material as the second bridge 154b.

Figure 9:
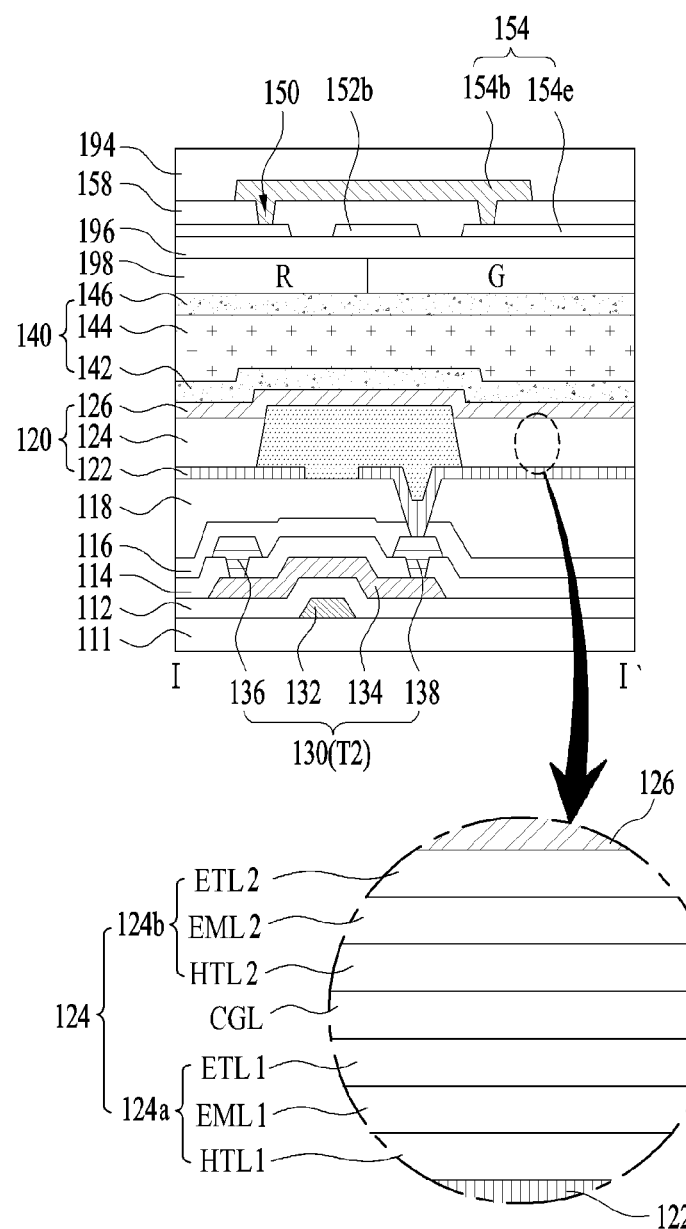
FIG. 9 is a sectional view illustrating an organic light emitting display with a touch sensor according to a third embodiment of the present disclosure.

In addition, as shown in FIG. 9, the organic light emitting display according to the present disclosure includes a touch buffer layer 196 formed between each of the touch sensing line 154 and the touch driving line 152, and the light emitting device 120. In the touch buffer layer 196, the distance between each of the touch sensing line 154 and the touch driving line 152, and the cathode 126 should be maintained at 5 μm or more. Accordingly, the capacitance of a parasitic capacitor formed between each of the touch sensing line 154 and the touch driving line 152, and the cathode 126 can be minimized and mutual effect by coupling between each of the touch sensing line 154 and the touch driving line 152, and the cathode 126 can thus be prevented.

Meanwhile, although an example in which a light emitting stack 124 is disposed between the anode 122 and the cathode 126 of the organic light emitting display according to the present disclosure has been illustrated, two or more light emitting stacks may be disposed. For example, as shown in FIG. 9, first and second light emitting stacks 124a and 124b are disposed between the anode 122 and the cathode 126. A charge generation layer (CGL) is disposed between the first and second light emitting stacks 124a and 124b. The first light emitting stack 124a includes a hole transport layer (HTL1), an organic light emitting layer (EML1) and an electron transport layer (EML1) stacked in this order on an anode 122, and the second light emitting stack 124b includes a hole transport layer (HTL2), an organic light emitting layer (EML2) and an electron transport layer (ELT2) stacked in this order on the charge generation layer (CGL). Here, any one of the organic light emitting layer (EML1) of the first light emitting stack 124*a* and the organic light emitting layer (EML2) of the second light emitting stack 124*b* generates blue light and the other of the organic light emitting layer (EML1) of the first light emitting stack 124 and the organic light emitting layer (EML2) of the second light emitting stack 124*b* generates yellow-green light, thereby generating white light through the first and second light emitting stacks 124*a* and 124*b*.

As such, according to the present disclosure, the touch sensor shown in FIGS. 1 to 9 may be applied to at least one light emitting stack 124 generating white light and the encapsulation part 140 of the organic light emitting display including color filters.

As apparent from the fore-going, the organic light emitting display with a touch sensor according to the present disclosure has a structure in which touch electrodes are directly disposed on the encapsulation part without an adhesive agent. Accordingly, the present disclosure does not require an additional adhesion process, thus simplifying a manufacturing process and reducing manufacture costs. In addition, the organic light emitting display with a touch sensor according to the present disclosure has a structure in which a display cover electrode of a display pad is disposed on the same plane as the conductive layer included in the touch sensor using the same material as the conductive layer, thereby preventing damage to the display pad electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a light-emitting device disposed on a substrate;
   an encapsulation unit disposed on the light-emitting device;
   a plurality of touch electrodes disposed on the encapsulation unit, the plurality of touch electrodes comprising a plurality of first touch electrodes arranged in a first direction and a plurality of second touch electrodes arranged in a second direction, which intersects the first direction;
   a plurality of bridges disposed on the encapsulation unit, the plurality of bridges comprising first bridges configured to interconnect the plurality of first touch electrodes and second bridges configured to interconnect the plurality of second touch electrodes; and
   a routing line including a first routing line electrically connected to the plurality of first touch electrodes and a second routing line electrically connected to the plurality of second touch electrodes,
   wherein each of the plurality of bridges has an opening formed therein,
   wherein the routing line is configured to have a structure in which a plurality of routing layers, comprising a lower routing layer and an upper routing layer, are stacked, and
   wherein the upper routing layer and the lower routing layer overlap each other on at least a portion of the encapsulation unit.

2. The display device according to claim 1, wherein the opening comprises a plurality of openings.

3. The display device according to claim 2, wherein the plurality of openings are linearly disposed.

4. The display device according to claim 1, further comprising:
   a touch dielectric film disposed between the first bridges and the second bridges, wherein
   the plurality of first touch electrodes, the plurality of second touch electrodes, and the first bridges are disposed on the encapsulation unit,
   the second bridges are disposed on the touch dielectric film, and
   the second bridges are connected to the plurality of second touch electrodes, which are exposed through touch contact holes formed through the touch dielectric film.

5. The display device according to claim 4, further comprising an auxiliary bridge disposed between the first bridges and the encapsulation unit, the auxiliary bridge being connected to the first bridges.

6. The display device according to claim 1, further comprising:
   a touch dielectric film disposed between the first bridges and the second bridges, wherein
   the second bridges are disposed on the encapsulation unit,
   the plurality of first touch electrodes, the plurality of second touch electrodes, and the first bridges are disposed on the touch dielectric film, and
   the plurality of second touch electrodes are connected to the second bridges, which are exposed through touch contact holes formed through the touch dielectric film.

7. The display device according to claim 1, wherein the second bridges are disposed between the plurality of first touch electrodes, the plurality of second touch electrodes, and the encapsulation unit.

8. The display device according to claim 1, wherein at least one of the first bridges, the second bridges, the plurality of first touch electrodes, or the plurality of second touch electrodes is configured to have a structure in which a plurality of conductive films is stacked.

9. The display device according to claim 8, wherein at least one of the plurality of conductive films is configured to have a multi-layered structure.

10. The display device according to claim 8, wherein at least one of the plurality of conductive films is configured to have a multi-layered structure comprising one of aluminum Al, titanium Ti, copper Cu, molybdenum Mo, indium tin oxide ITO, or indium zinc oxide IZO.

11. The display device according to claim 8, wherein at least one of the plurality of conductive films comprises one of titanium/aluminum/titanium or molybdenum/aluminum/molybdenum.

12. The display device according to claim 1, wherein at least one of the plurality of first touch electrodes, the plurality of second touch electrodes, the first bridges, or the second bridges comprises a mesh-shaped conductive film having an opening formed therein.

13. The display device according to claim 12, wherein the mesh-shaped conductive film overlaps a bank configured to define a light-emitting region of the light-emitting device.

14. The display device according to claim 13, wherein the opening overlaps the light-emitting region.

15. The display device according to claim 13, wherein the bank is disposed such that the opening has a diamond shape.

16. The display device according to claim 13, wherein the mesh-shaped conductive film is disposed along the bank.

17. The display device according to claim 1, wherein the routing line is formed along a side surface of the encapsulation unit.

18. The display device according to claim 17, wherein the routing line contacts the side surface of the encapsulation unit.

19. The display device according to claim 1, further comprising a touch buffer film disposed between the encapsulation unit and the plurality of touch electrodes.

20. The display device according to claim 19, wherein the routing line is formed along a side surface of the touch buffer film.

21. The display device according to claim 20, wherein the routing line contacts the side surface of the touch buffer film.

22. The display device according to claim 1, wherein the display device is bendable and curvable.

23. The display device according to claim 22, wherein an organic layer is disposed in a bendable and curvable region of the display device.

24. The display device according to claim 1, wherein
the lower routing layer and the upper routing layer have different widths, and
the lower routing layer and the upper routing layer have different thicknesses.

25. The display device according to claim 24, wherein a width of the lower routing layer is larger than a width of the upper routing layer, and a thickness of the upper routing layer is larger than a thickness of the lower routing layer.

26. The display device according to claim 1, wherein
the lower routing layer is disposed on a same layer and is made of a same material as one of the first bridges and the second bridges, and
the upper routing layer is disposed on a same layer and is made of a same material as another one of the first bridges and the second bridges.

27. The display device according to claim 1, further comprising:
a touch pad connected to the routing line, wherein at least one of the upper routing layer or the lower routing layer is connected to the touch pad.

28. The display device according to claim 1, further comprising an interlayer film disposed between the upper routing layer and the lower routing layer.

29. The display device according to claim 28, wherein the interlayer film comprises one of a transparent conductive film and a transparent dielectric film.

30. The display device according to claim 28, wherein at least one of the upper routing layer, the lower routing layer, or the interlayer film comprises one of titanium/aluminum/titanium or molybdenum/aluminum/molybdenum.

31. The display device according to claim 1, further comprising:
a touch pad connected to the routing line, wherein
the touch pad is configured to have a structure in which a plurality of pad layers is stacked.

32. The display device according to claim 31, wherein at least one of the plurality of pad layers is configured to have a multi-layered structure.

33. The display device according to claim 31, wherein at least one of the pad layers comprises one of titanium/aluminum/titanium or molybdenum/aluminum/molybdenum.

34. The display device according to claim 31, wherein at least one of the plurality of pad layers is disposed on a same layer and is made of a same material as at least one of the first bridges or the second bridges.

35. The display device according to claim 31, wherein a total number of routing lines extending from a left side and a right side of the display device to the touch pad is equal to or different from a total number of routing lines extending from an upper side and a lower side of the display device to the touch pad.

36. The display device according to claim 31, further comprising:
a thin film transistor connected to the light-emitting device, wherein
the thin film transistor comprises:
a gate electrode disposed on the substrate;
an active layer disposed on or under the gate electrode;
a source electrode connected to the active layer; and
a drain electrode connected to the active layer.

37. The display device according to claim 36, wherein the routing line and the touch pad, disposed at an outer edge of the substrate, are disposed on one of a plurality of dielectric films located between the light-emitting device and the substrate.

38. The display device according to claim 37, wherein the plurality of dielectric films comprise:
a gate dielectric film disposed on the gate electrode and the active layer of the thin film transistor;
a passivation film disposed between the source electrode and the drain electrode and the active layer of the thin film transistor; and
a planarization layer disposed on the source electrode and the drain electrode.

39. The display device according to claim 38, wherein the routing line overlaps at least one of the gate dielectric film, the passivation film, a bank configured to define a light-emitting region of the light-emitting device, the planarization layer, or the encapsulation unit at the outer edge of the substrate.

40. The display device according to claim 1, wherein a distance between the substrate and the routing line is smaller than a distance between the substrate and the plurality of touch electrodes.

41. The display device according to claim 1, wherein
the encapsulation unit comprises a first inorganic encapsulation layer and a second inorganic encapsulation layer that face each other in a state in which an organic encapsulation layer is disposed therebetween,
the second inorganic encapsulation layer is disposed so as to cover an upper surface and a side surface of the organic encapsulation layer, and
the organic encapsulation layer is disposed so as to cover an upper surface and a side surface of the first inorganic encapsulation layer.

* * * * *